US006674376B1

(12) United States Patent
Nishimura

(10) Patent No.: US 6,674,376 B1
(45) Date of Patent: Jan. 6, 2004

(54) PROGRAMMABLE VARIABLE LENGTH DECODER CIRCUIT AND METHOD

(75) Inventor: Satoshi Nishimura, Irvine, CA (US)

(73) Assignee: Morpho Technologies, Irvine, CA (US)

( * ) Notice: Subject to any disclaimer, the term of this patent is extended or adjusted under 35 U.S.C. 154(b) by 0 days.

(21) Appl. No.: 10/243,126

(22) Filed: Sep. 13, 2002

(51) Int. Cl.[7] .............................................. H03M 7/40
(52) U.S. Cl. .............................. 341/67; 341/61; 341/63; 341/65
(58) Field of Search ............................... 341/67, 82, 65, 341/63, 61, 50, 51

(56) References Cited

U.S. PATENT DOCUMENTS

| 5,173,695 A | | 12/1992 | Sun et al. | |
| 5,561,690 A | * | 10/1996 | Park | 375/340 |
| 5,666,116 A | * | 9/1997 | Bakhmutsky | 341/67 |
| 5,675,331 A | | 10/1997 | Watanabe et al. | |
| 5,754,128 A | * | 5/1998 | Kang | 341/67 |
| 5,901,177 A | * | 5/1999 | Sohn | 375/240 |
| 5,990,812 A | | 11/1999 | Bakhmutsky | |
| 6,501,398 B2 | * | 12/2002 | Toyokura | 341/67 |

* cited by examiner

Primary Examiner—Brian Young
Assistant Examiner—John Nguyen
(74) Attorney, Agent, or Firm—Gray Cary Ware & Freidenrich LLP

(57) ABSTRACT

Apparatuses and methods for decoding a bit stream of variable-length and fixed-length codewords representing encoded digital content. A decoder includes a memory for storing microinstructions that control the decoder. The decoder further includes a first barrel shifter for extracting a first bit field from the bit stream, a position of the first bit field being specified by the microinstruction, and a second barrel shifter for extracting a second bit field from the bit stream, a position of the second bit field being specified by the microinstructions. A microprogram counter keeps an address of a currently-executing microinstruction of the microinstructions, where a next state of the microprogram counter is determined by the microinstructions and the first bit field. A data converter modifies a value of the second bit field according to the microinstructions. A data storage stores either data in the microinstructions or an output of the data converter as decoded data values.

4 Claims, 5 Drawing Sheets

PROGRAMMABLE VARIABLE LENGTH DECODER CIRCUIT AND METHOD

BACKGROUND

This invention relates to digital content, and more particularly to a decoder for fixed- and variable-length codewords (VLC). Digital content such as video can be transmitted as a series of bit streams encoded according to one of various encoding standards. For example, some standards fall under the auspices of the Moving Pictures Expert Group (MPEG), a joint committee of the International Standards Organization (ISO) whose purpose is to develop standards for the compression, encoding, etc. of digital media. MPEG standards include MPEG-1, MPEG-2, and MPEG-4. Other digital content encoding standards exist, including standards for digital images by the Joint Photographic Experts Group (JPEG), and for High Definition Television (HDTV). A digital content stream that is encoded for transmission conventionally requires a decoder to translate the encoded bit streams into a format that can be output and rendered.

An encoded bit stream generally consists of a sequence of variable-length and fixed-length codewords. Each codeword represents a discrete cosine transfer (DCT) coefficient, motion vector element, macroblock type, coded block pattern, image parameter, and so on. The DCT coefficients need to be generated at certain high speeds. For example, for decoding HDTV streams, DCT coefficients need to be generated at approximately 100 MHz. To achieve this speed, a decoder needs to be self-controlled. In other words, the decoder must be able to decode the DCT coefficients of several 8-pixel×8-pixel blocks without the intervention of a host processor.

Conventional decoders use complex table-lookup memory devices for storing a code length and associated value for each codeword. The table-hookup memory devices are typically implemented with content addressable memory (CAM), programmable logic devices (PLDs), or a combination of a PLD and several random access memories (RAMs). In addition, decoders which use these types of memory devices require a controller, which contains an additional memory device for storing the protocol or instructions according to which the controller operates.

Several problems with conventional decoders includes high costs, limited programmability, and complicated testing procedures. CAM or PLD is generally much more expensive than RAM. Moreover, existing decoders need multiple memory devices, which complicates testing procedures and also limits the decoder's programmability because the capacity for each memory device is usually fixed.

SUMMARY OF THE INVENTION

The above problems are solved by a decoder which uses a single RAM device for storing all of the look-up tables as well as decoder protocols. Because there is only a single RAM device, the decoder is simple and highly flexible. In addition, the decoder does not require costly CAM or PLDs. To realize the full function of a decoder with a single RAM, an embodiment of the decoder includes a program counter whose value is controllable by the RAM contents as well as binary values in the input stream. The decoder also includes a condition register for controlling the value of the program counter. The decoder is applicable to different coding standards including MPEG-1, MPEG-2, MPEG-4, and JPEG, and has a sufficient performance for decoding HDTV video streams.

In one embodiment, an apparatus includes a memory, a first barrel shifter, a second barrel shifter, a microprogram counter, a data converter, and a data storage. The memory stores microinstructions that control the apparatus. The first barrel shifter extracts a first bit field from the bit stream, a position of the first bit field being specified by the microinstructions. The second barrel shifter extracts a second bit field from the bit stream, a position of the second bit field being specified by the microinstructions. The microprogram counter keeps an address of a currently-executing microinstruction of the microinstructions, a next state of the microprogram counter being determined by the microinstructions and the first bit field. The data converter modifies a value of the second bit field according to the microinstructions. The data storage stores either data in the microinstructions or an output of the data converter as decoded data values.

In another embodiment, a method includes accessing a sequence of microinstructions that are stored in a microprogram memory; extracting a first bit field from the bit stream, a position of the first bit field being specified by the microinstructions; and extracting a second bit field from the bit stream, a position of the second bit field being specified by the microinstructions. The method further includes keeping an address of a currently-executing microinstruction of the microinstructions, a next state of the microprogram counter being determined by the microinstructions and the first bit field. The method further includes modifying a value of the second bit field according to the microinstructions. The method further includes storing either data in the microinstructions or an output of the data converter as decoded data values.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
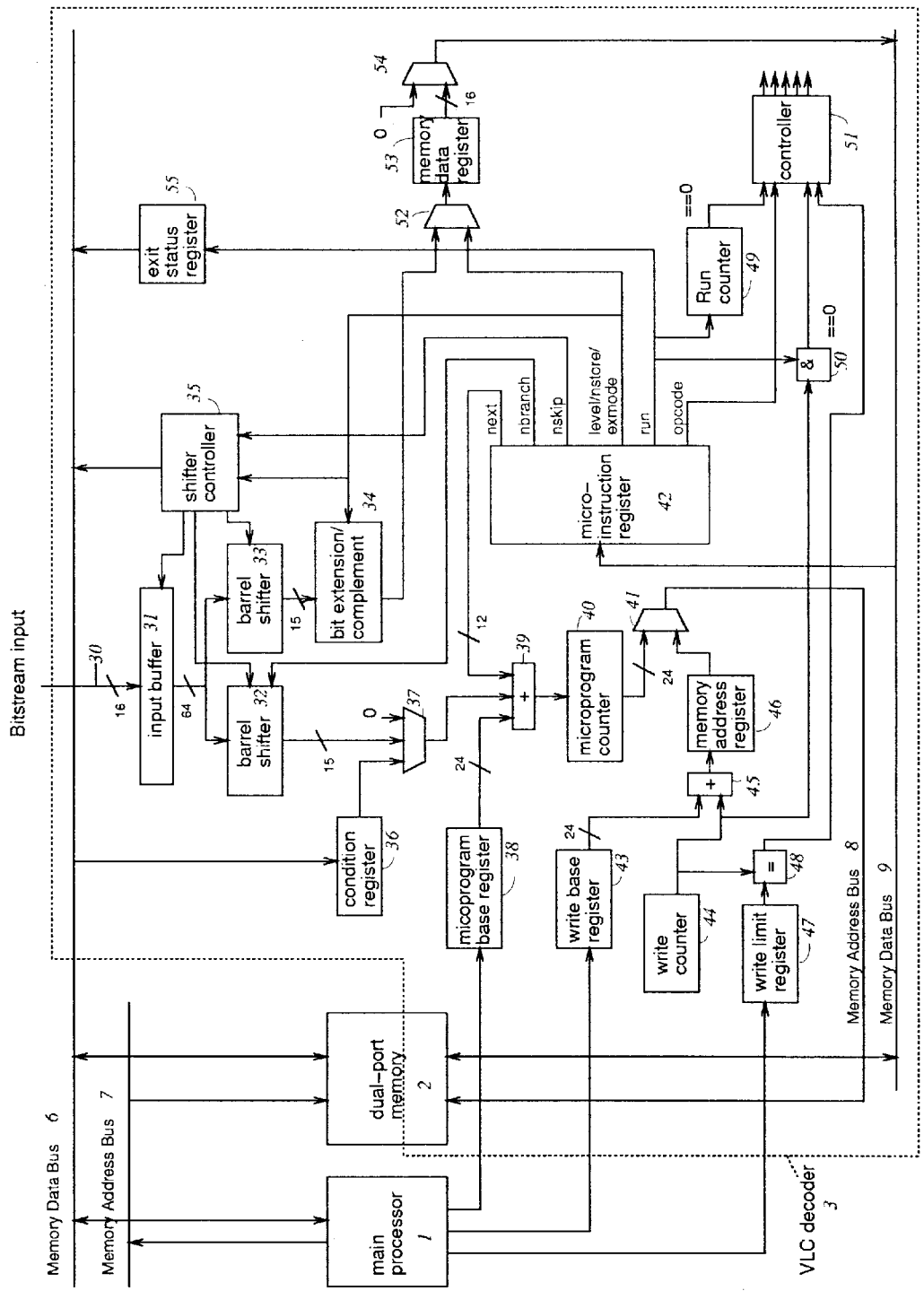
FIG. 1 illustrates a decoder according to an embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF A PREFERRED EMBODIMENT

FIG. 1 illustrates a decoder 100, which includes a main processor 1, a dual-port memory 2, and a VLC decoder 3. The decoder 100 is suitable for decoding MPEG-compliant bitstreams, as well as HDTV or other encoded bitstreams. The main processor 1 is responsible for inverse discrete cosine transform (IDCT), inverse quantization, and any other decoding functions except for VLC decoding. The dual-port memory 2 stores a microprogram for the VLC decoder 3 as well as decoded data values generated by the VLC decoder 3. The dual-port memory 2 is accessible from both the main processor 1 and the VLC decoder 3. The VLC decoder 3 receives an encoded bitstream, parses the bitstream according to the microprogram, and stores decoded data values to the dual-port memory 2. Look-up tables and protocols for the VLC decoder 3 are contained within the microprogram, thereby dispensing with the need for additional memory devices.

The VLC decoder 3 functions as a coprocessor of the main processor 1. To start VLC decoding, the main processor 1 executes a special co-processor instruction. The co-processor instruction includes a number of operands, which include operands for, specifying the address where the microprogram begins, specifying the address where the decoded data values are stored from, and specifying the maximum number of the decoded data values. When the co-processor instruction is executed, the main processor 1 sets these operand values to a microprogram base register 38, a write base register 43, and a write limit register 47 respectively, and then signals the VLC decoder 3 to start VLC decoding. The VLC decoder 3 continues its operation until the number of decoded data values reaches the maximum number specified by the operand, or a microinstruction for terminating VLC decoding is executed in the VLC decoder 3. While the VLC decoder is operating, the main processor 1 can perform other tasks such as IDCT, thus achieving parallel processing between the main processor 1 and the VLC decoder 3.

The internal structure of the VLC decoder 3 is also shown in FIG. 1. The bitstream is fed into the VLC decoder 3 through an input port 30, preferably in chunks of 16 bits. However those having skill in the art would recognize that the input bitstream can have other sizes. Where 16-bit chunks are used, an input buffer 31 keeps the most recent 64 bits in the bitstream. Whenever 16 bits or more in the input buffer 31 become no longer necessary because their decoding is finished, the oldest 16 bits in the input buffer 31 are discarded, and then a new 16 bits are loaded from the input port 30. The input buffer 31 is connected to two barrel shifters 32 and 33. A first barrel shifter 32 extracts a bit field from the 64-bit value stored in the input buffer 31. This bit field value is used as a displacement for the jump target address of a microcode. The shift amount of the barrel shifter 32 is specified by a shifter controller 35. The width of the bit field is determined by the "nbranch" field of a microinstruction register 42.

A second barrel shifter 33 extracts another bit field from the 64-bit value stored in the input buffer 31. Its shift amount is specified by the shifter controller 35, and the width of the bit field is determined by the "nstore" field of the microinstruction register 42. The value of the bit field extracted by the barrel shifter 33 is used as a decoded value after modification by a bit extension/complement circuit (BECC) 34. The BECC 34 extends the value of the bit field with one of the following extension modes: zero extension, one extension, or sign extension. The BECC 34 can also apply a 1's complement and/or increment operation to the extended value. This feature is useful for handling MPEG escape codes or DC coefficients.

The shifter controller 35 generates the control signals to the barrel shifters 32 and 33 as described above, and also controls the data transfer to the input buffer 31 from the input port 30. Inside the shifter controller 35, the number of un-decoded bits in the input buffer 31 (denoted by $n_u$) is maintained. The control signals are generated based on the value of $n_u$ as well as the field values of a microinstruction currently being executed. After the execution of each microinstruction, $n_u$ is increased by the number of new bits loaded from the input port 30 minus the number of bits consumed by the executed microinstruction. The value of $n_u$ can be read by the main processor 1 through the memory data bus 6.

The address of a microinstruction currently being executed is kept in a microprogram counter 40. The next state of the program counter is calculated by a first multiplexer 37 and a first adder 39. The first multiplexer 37 selects one of the following values for its output depending on the type of microinstruction currently being executed: the output of the barrel shifter 32, the output of a condition register 36, or zero. The first adder 39 calculates the sum of the output of the first multiplexer 37, the value of the microprogram base register 38, and the address offset specified in the microinstruction currently being executed.

When the VLC decoder fetches a microinstruction from the dual-port memory 2, the value of the microprogram counter 40 is outputted to the memory address bus 8 through a second multiplexer 41. Then, the microinstruction is transmitted to a microinstruction register 42 from the dual-port memory 2 through the memory data bus 9. Each microinstruction generates a sequence of decoded data values consisting of up to 63 leading zeros and up to one significant value. The sequence is stored to the dual-port memory 2 using the memory data bus 9 and memory address bus 8. Prior to writing the sequence, the significant value is selected by a third multiplexer 52 and temporarily placed in a memory data register 53. Then, zeros are written to the dual-port memory 2, which counts with a run counter 49. During this phase, the zero value is selected by a fourth multiplexer 54. After zeros are written, the fourth multiplexer 54 is switched to the output of the memory data register 53 so that the significant value is written.

Memory addresses during the storing sequence are generated by a write counter 44, a write base register 43, a second adder 45 and a memory address register 46. The write counter 44 is cleared to zero when the VLC decoder 3 is started by the main processor 1. Then, it is incremented by one whenever a decoded data value (whether it is significant or not) is written. The output of the write counter 44 is added with the value of the write base register 43 by the second adder 45 before stored to the memory address register 46. Each time the write counter 44 is incremented, its value is compared with the value of the write limit register 47 by an identity comparator 48. VLC decoding is terminated when the identity is detected.

To inform the main processor 1 of errors in the bitstream, an exit status register 55 is provided. The exit status register 55 is cleared to zero when the VLC decoder 3 is started by the main processor 1, and set to a user-specified value when a microinstruction for terminating VLC decoding is executed.

Figure 2:
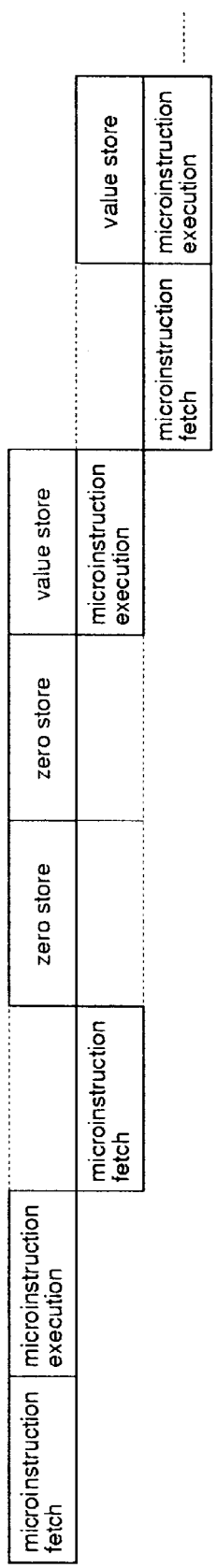
FIG. 2 illustrates a pipelined execution of microinstructions according to an embodiment.

The microinstruction execution in the VLC decoder 3 may be pipelined. FIG. 2 shows an example of a pipeline chart, in which each column represents a different clock period and each row corresponds to a different microinstruction. With reference to both FIG. 1 and 2, in a "microinstruction fetch" stage, a microinstruction is read from the dual-port memory 2 and stored into the microinstruction register 42. In a "microinstruction execution" stage, bit fields are extracted by the barrel shifters 32 and 33, a data value is stored to the memory data register 53, a write address is stored to the memory address register 46, and the number of leading zeros to be stored is loaded to the run counter 49. In a "zero store" stage, one of the leading zeros is written to the dual-port memory 2. In a "value store" stage, the data value stored in the memory data register 53 is written to the dual-port memory 2. With pipelining, the minimum number of cycles per microinstruction is 2. The control of pipelining is performed by a controller 51.

Figure 3:
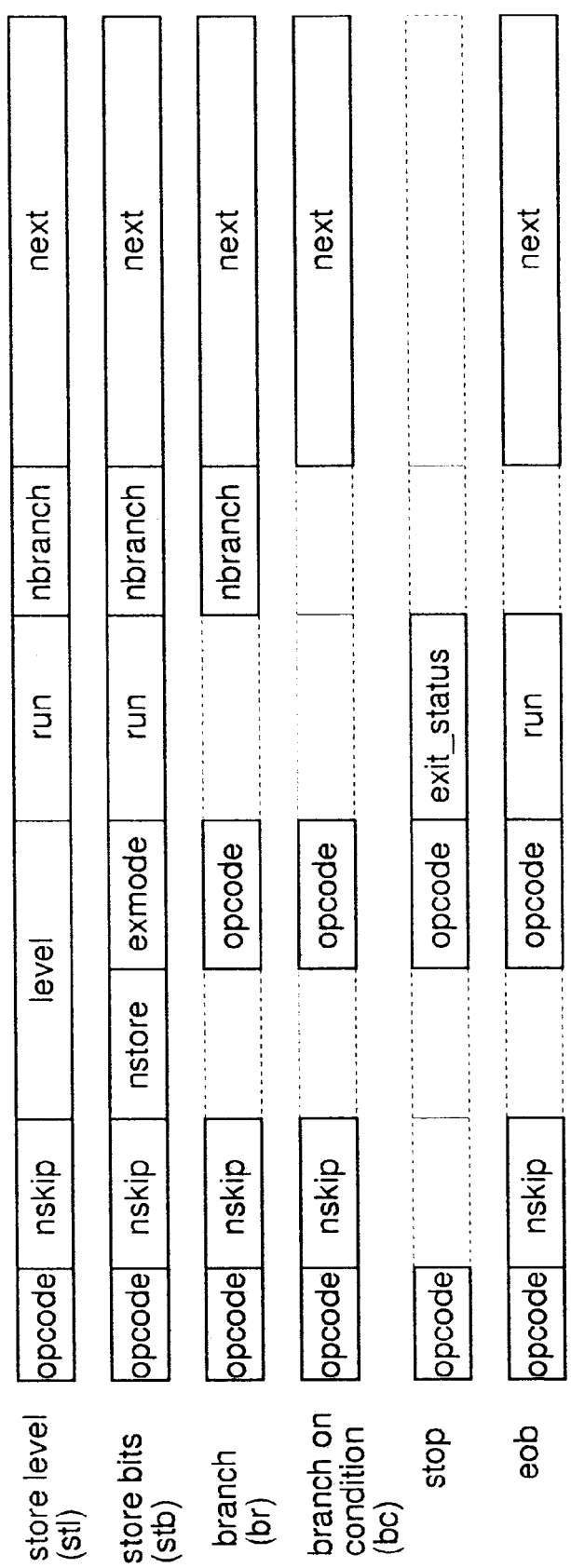
FIG. 3 illustrates an exemplary set of microinstructions supported by the decoder shown in FIG. 1.

FIG. 3 shows an exemplary set of microinstructions supported by the VLC decoder 3. In the example shown, there are seven types of microinstructions. The "opcode" fields discriminate between the types of the microinstructions. The "next" field specifies the address offset of the microinstruction to be executed next. The "store level" microinstruction first generates a sequence of zeros and then generates a data value that is equal to the value of the "level" field sign-extended to 16 bits. The "run" field specifies the number of zeros. The address of the microinstruction executed next will be the sum of the value of the "next" field, the value of the microprogram base register 38, and a displacement value obtained from the bitstream. The position of the displacement value in the bitstream is determined by the "nskip" and "nbranch" fields. The "nskip" field specifies the number of bits skipped before extracting the displacement value. The "nbranch" field represents the number of bits for the displacement value. After the execution of the "store level" microinstruction, the bitstream is consumed by "nskip" bits.

The "store bits" microinstruction first generates a sequence of zeros and then generates a data value obtained from the bitstream. The "run" field specifies the number of zeros. The position of the data value is determined by the "nskip" and "nstore" fields. The "nskip" field specifies the number of bits skipped before extracting the data value. The "nstore" field means the number of bits for the data value. The data value obtained from the bitstream is then modified by the BECC 34 before being sent to the dual-port memory 2.

The "exmode" field specifies the function of the BECC 34. When the "nstore" field is zero, no data value is stored. Similarly to the "store level" microinstruction, the address of the microinstruction executed next will be the sum of the value of "next" field, the value of the microprogram base register 38, and a displacement value obtained from the bitstream. The displacement value is located in the bitstream immediately after the data value. The "nbranch" field specifies the number of bits for the displacement value. After the execution of the "store bits" microinstruction, the bitstream is consumed by ("nskip"+"nstore") bits.

The "branch" microinstruction changes the value of the microprogram counter 40 without generating any decoded data values. The address of the microinstruction executed next is determined with the same rule as the "store level" microinstruction. After the execution of the "branch" microinstruction, the bitstream is consumed by "nskip" bits. The "branch on condition" microinstruction also changes the value of the microprogram counter 40 without generating any decoded data values. It differs in that the address of the microinstruction executed next will be the sum of the value of the "next" field, the value of the microprogram base register 38, and a 1-bit displacement value corresponding to the least significant bit of the condition register 36. In one embodiment, the condition register 36 is a 32-bit register initialized by the main processor 1 through the memory data bus 6. Each time when the "branch on condition" microinstruction is executed, the condition register 36 is shifted right by one bit. After the execution of the "branch on condition" microinstruction, the bitstream is consumed by "nskip" bits. The "stop" microinstruction terminates VLC decoding. The "exit_status" field specifies the value written to the exit status register 55.

The "eob" microinstruction stores a sequence of zero values to the dual-port memory 2 until the value of write counter 44 logically-AND'ed with the value of the "run" field becomes zero. The logical AND operation is performed by an AND circuit 50. This microinstruction is used for filling zeros for the rest of a block. The address of the microinstruction executed next will be the sum of the value of the "next" field and the value of the microprogram base register 38. After the execution of the "eob" microinstruction, the bitstream is consumed by "nskip" bits.

Figure 4:
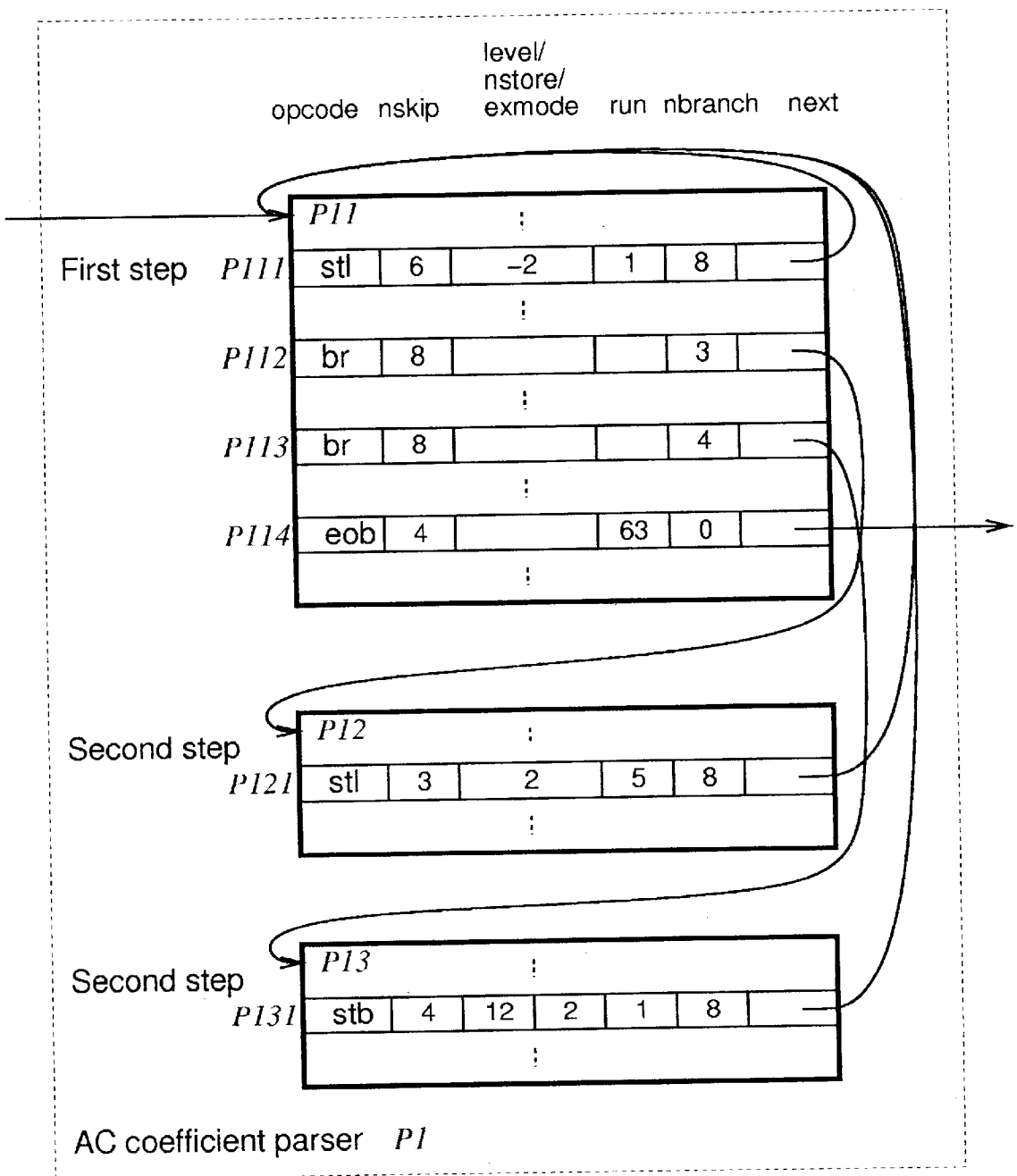
FIG. 4 illustrates a microprogram for parsing MPEG-2 AC coefficients.

A method for decoding MPEG bitstreams using the VLC decoder 3 will now be explained. FIG. 4 illustrates a microprogram for parsing MPEG-2 AC coefficients. Although only a parser for MPEG-2 is shown, similar approach can be applied for decoding MPEG-4 AC coefficients as well. In this example of a microprogram, each codeword is decoded through the successive execution of one or two microinstructions depending on the length of the codeword. More specifically, codewords having a length of 8 bits or less are handled with one microinstruction, otherwise two microinstructions are used. The microinstruction executed first is selected among 256 microinstructions P11 depending on the value of eight consecutive bits in the bitstream starting from the leftmost bit of the codeword. Note that this selection is the responsibility of the previous microinstruction, that is, the last microinstruction executed for the preceding DC or AC coefficient.

When the codeword length of the AC coefficient is 8 bits or less, the microinstruction executed will be a "store level" microinstruction P111, which (1) generates successive zeros according to the run length, (2) generates a decoded value, (3) consumes the number of bits corresponding to the codeword length, and (4) selects one of the 256 microinstructions P11 based on succeeding eight bits in the bitstream for the next AC coefficient. To fulfill this functionality, the "store level" microinstruction P111 has the decoded value in its "level" field, the run length in its "run" field, the codeword length in its "nskip" field, and "8" in its "nbranch" field.

When the codeword length is more than 8 bits, the microinstruction executed first will be a "branch" microinstruction P112, which selects another microinstruction executed next. The number of bits used for this second-level selection is the maximum additional codeword length given that the first eight bits are the ones used at the first-level selection. For example, in MPEG-2 decoding, when the first eight bits are "00000010", the maximum possible codeword length including the sign bit is eleven bits, and then, the number of bits for the second-level selection is three. Consequently, the "branch" microinstruction P112 has three in its "nbranch" field, and it selects the next microinstruction among eight microinstructions P12. The next microinstruction is, for example, a "store level" microinstruction P121, which fulfills a functionality similar to the "store level" microinstruction P111.

The AC coefficient parser can operate using escape codes. For example, the MPEG-2 escape code consists of a 6-bit prefix "000001", a 6-bit run length and a 12-bit level. Then, the first-level selection will recognize the 6-bit prefix and first two bits of the 6-bit run length. The first microinstruction will be a "branch" microinstruction P113, which selects one of 16 microinstructions P13 executed next according to the remaining four bits of the run length. The next microinstruction is a "store bits" microinstruction P131, which (1) generates successive zeros according to the run length, (2) generates a decoded value equal to the sign-extended value of the 12-bit level, (3) consumes 16 bits, and (4) selects one of the 256 microinstructions P11 based on succeeding eight bits in the bitstream for the next AC coefficient. Accordingly, the "store bits" microinstruction has "12" in its "nstore" field, the run length in its "run" field, "2" in the "exmode" field meaning sign extension, "4" in its "nskip" field, and "8" in its "nbranch" field.

When the AC coefficient parser encounters the codeword representing "end of block", an "eob" microinstruction P114 is executed. The "eob" microinstruction P114 (1) fills zeros for the rest of the 64-word block, (2) consumes the number of bits corresponding to the length of the codeword, and (3) terminates the parser. Although the above example of an AC coefficient parser first examines eight bits in the bitstream, it is possible to construct another microprogram to examine a different number of bits. For example, it is possible to construct a microprogram which first examines six bits, then examines the succeeding seven bits, and finally examines the remaining bits. In such a microprogram, each codeword will be treated with up to three microinstructions. It is even possible to use a different number distribution of examining bits from codeword to codeword. These factors can be decided considering trade-offs between performance and memory requirement.

Figure 5:
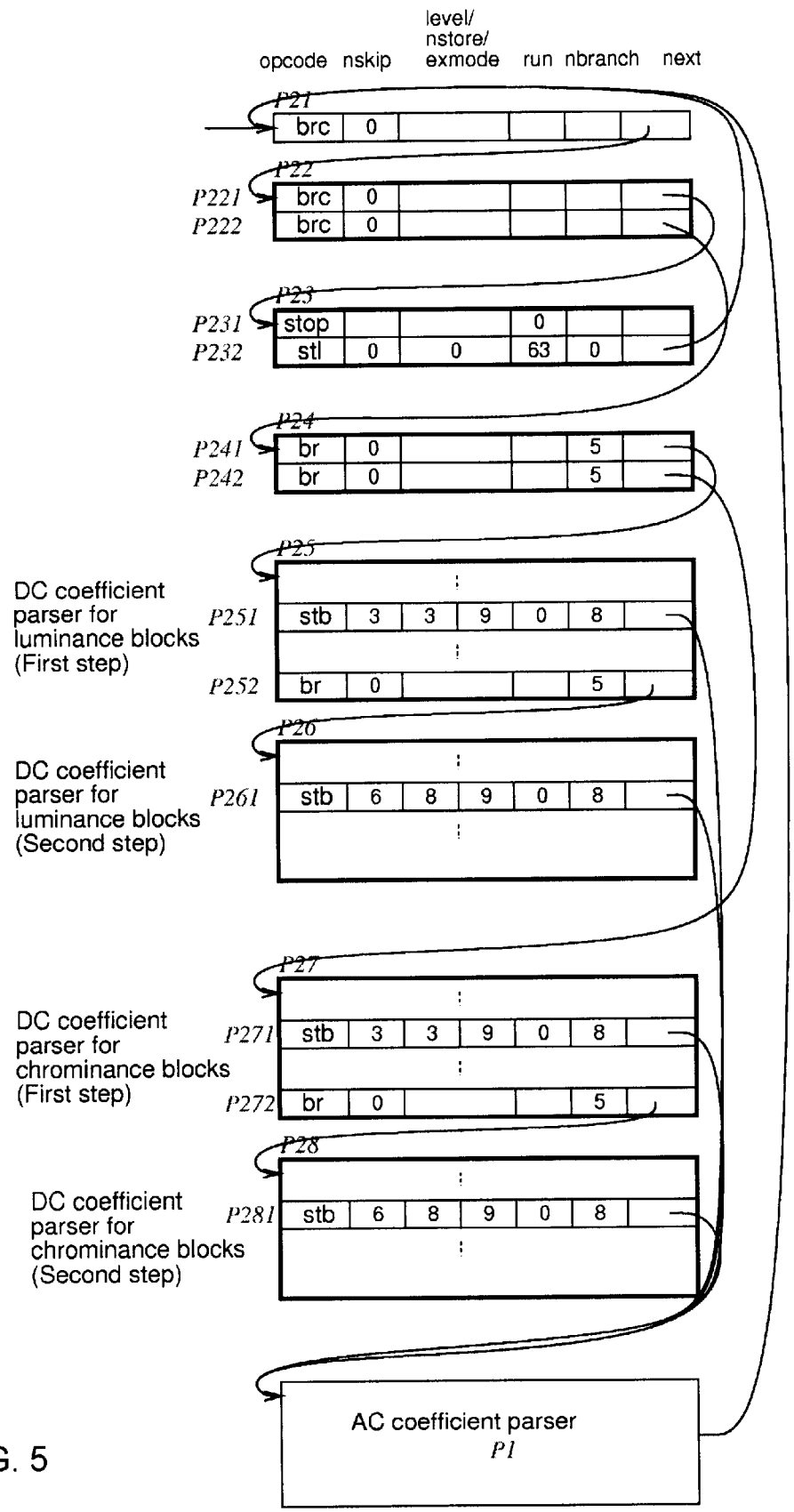
FIG. 5 illustrates a microprogram for parsing DCT coefficients in an MPEG-2 macroblock.

FIG. 5 illustrates a microprogram for parsing DCT coefficients in an MPEG-2 macroblock. An MPEG-2 macro block consists of four luminance blocks and two chrominance blocks. Each block has one DC coefficient and 63 AC coefficients. If at least one of the coefficients is non-zero, the block is coded with a codeword for a DC coefficient followed by one or more codewords for AC coefficients. The codeword syntax of the DC coefficient for a luminance block is slightly different from that for a chrominance block, and therefore, separate parsers are required. The codeword syntax of AC coefficients is the same throughout a given macroblock. If all of the coefficients in the macroblock are zero, the coding of the entire block is skipped. To identify whether each block is coded or not, 6-bit information called a coded block pattern is transmitted for each macroblock prior to DCT coefficients.

The parser shown in FIG. 5 uses the condition register 36 to store the attribute of each block. Each block is assigned one of the following 2-bit attributes:
00: the block is not existent;
10: the block is not coded;
01: the block is coded and is a luminance block
11: the block is coded and is a chrominance block.

Before running the parser, the main processor 1 initializes the condition register 36 by referencing the coded block pattern described earlier. For example, if the coded block pattern is "101111," meaning that all blocks except the second block are coded, then the 32-bit condition register 36 is initialized to "00000000000000000000111101011001". Note that the most significant bit corresponds to the first block in the coded block pattern, while the least significant two bits correspond to the first block in the condition register value.

The parsing is done as follows. The first "branch on condition" microinstruction P21 examines the least significant bit of the condition register 36 and selects one of two microinstructions P22. Each of the two microinstructions P22 then further chooses a next microinstruction depending on the next bit of the condition register 36. As a result, according to the attribute of the block, one of the four microinstructions P231, P232, P241 and P242 is executed. When the attribute is "00", the parsing process is terminated with the "stop" microinstruction P231. When the attribute is "10", i.e., when the block is not coded, the "store level" microinstruction P232 generates 64 zeros and returns to the first microinstruction P21.

When the attribute is "01", the "branch" microinstruction P241 is executed, which chooses one of 32 microinstructions P25 depending on the next five bits in the bitstream, in order to decode a DC coefficient for a luminance block. The codeword of the DC coefficient consists of two parts: a variable-length code denoting the number of significant bits in the DC coefficient, and an additional code representing the actual value. The first bit of the additional code indicates the sign of the DC coefficient. If the length of the variable-length code is 4 bits or less, a "store bits" microinstruction P251 will be chosen. The microinstruction stores the additional code as a decoded value. The "exmode" field of the "store bits" microinstruction P251 should be "0" for positive DC coefficients so that zero extension is used and "9" for negative coefficients so that the value of the additional code is first one-extended and then incremented by 1. When the length of the variable-length code is more than 4 bits, a "branch" microinstruction P252 is first executed, and then a "store bits" microinstruction P261 is executed. After the DC coefficient is parsed, the control of the microprogram moves to the AC coefficient parser P1 and finally returns to the first microinstruction P21. When the attribute is "11", a DC coefficient for a chrominance block is decoded in the same way as the case when the attribute is "01". The only difference lies in the arrangement of microinstructions due to the difference in the syntax of the variable-length code denoting the number of significant bits.

With the parser microprogram shown in FIG. 5, the VLC decoder shown in FIG. 1 decodes each codeword with the following number of clock cycles:

Codeword for a DC coefficient (4 bits or less): 2 cycles;
Codeword for a DC coefficient (5 bits or more): 4 cycles;
Variable-length codeword for an AC coefficient (8 bits or less): (2+r) cycles;
Variable-length codeword for an AC coefficient (9 bits or more): (4+r) cycles;
Escape code for an AC coefficient: (4+r) cycles;
where r represents the run length. These numbers are sufficient to decode HDTV video streams if the clock speed is 200 MHz or more. The total number of microinstructions required for decoding both intra and non-intra macroblocks is 2090.

To reduce the number of microinstructions, it is possible to construct another version of a microprogram that allows the execution of the third microinstruction in decoding AC coefficients. In this case, the number of clock cycles for each codeword is as follows:

Codeword for a DC coefficient (4 bits or less): 2 cycles;
Codeword for a DC coefficient (5 bits or more): 4 cycles;
Variable-length codeword for an AC coefficient (8 bits or less): (2+r) cycles;
Variable-length codeword for an AC coefficient (from 9 to 15 bits): (4+r) cycles;
Variable-length codeword for an AC coefficient (16 bits or more): (6+r) cycles;
Escape code for an AC coefficient: (4+r) cycles;
The total number of microinstructions is reduced to 1642. Because codewords longer than 16 bits are very rarely used, this microprogram is also sufficient to decode HDTV video streams.

With a microprogram for decoding an MPEG-4 macroblock, the VLC decoder shown in FIG. 1 can decode each codeword with the following number of clock cycles:

Codeword for a DC coefficient (4 bits or less): 2 cycles;

Codeword for a DC coefficient (5 bits or more, without a maker bit): 4 cycles;

Codeword for a DC coefficient (5 bits or more, with a maker bit): 6 cycles;

Variable-length codeword for an AC coefficient (8 bits or less): (2+r) cycles;

Variable-length codeword for an AC coefficient (from 9 to 15 bits): (4+r) cycles;

Variable-length codeword for an AC coefficient (16 bits or more): (6+r) cycles;

3rd escape code for an AC coefficient: (6+r) cycles;

The 1st and 2nd escape codes are classified as variable-length codewords in the above table. These numbers are sufficient to decode HDTV video streams if the clock speed is 200 MHz or more. The total number of microinstructions for decoding both intra and nonintra macroblocks is 2779.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. An apparatus for decoding a bit stream of variable-length and fixed-length codewords, comprising:

a memory for storing microinstructions that control said apparatus;

a first barrel shifter for extracting a first bit field from said bit stream, a position of said first bit field being specified by said microinstructions;

a second barrel shifter for extracting a second bit field from said bit stream, a position of said second bit field being specified by said microinstructions;

a microprogram counter for keeping an address of a currently-executing microinstruction of said microinstructions, a next state of said microprogram counter being determined by said microinstructions and said first bit field;

a data converter for modifying a value of said second bit field according to said microinstructions; and a data storage for storing either data in said microinstructions or an output of said data converter as decoded data values.

2. The apparatus of claim 1, further comprising:

a host processor that stores condition values; and a condition register for keeping condition values stored by the host processor, wherein each of said condition values contributes to the next state of said microprogram counter.

3. The apparatus of claim 1 wherein execution of said microinstructions is pipelined.

4. An method for decoding a bit stream of variable-length and fixed-length codewords in a bit stream, comprising:

accessing a sequence of microinstructions that are stored in a microprogram memory;

extracting a first bit field from said bit stream, a position of said first bit field being specified by said microinstructions;

extracting a second bit field from said bit stream, a position of said second bit field being specified by said microinstructions;

keeping an address of a currently-executing microinstruction of said microinstructions, a next state of said microprogram counter being determined by said microinstructions and said first bit field;

modifying a value of said second bit field according to said microinstructions; and storing either data in said microinstructions or an output of said data converter as decoded data values.

* * * * *